United States Patent
Lin et al.

(10) Patent No.: US 7,727,876 B2
(45) Date of Patent: Jun. 1, 2010

(54) SEMICONDUCTOR DEVICE AND METHOD OF PROTECTING PASSIVATION LAYER IN A SOLDER BUMP PROCESS

(75) Inventors: Yaojian Lin, Singapore (SG); Haijing Cao, Singapore (SG); Qing Zhang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 175 days.

(21) Appl. No.: 11/934,009

(22) Filed: Nov. 1, 2007

(65) Prior Publication Data
US 2008/0150161 A1 Jun. 26, 2008

Related U.S. Application Data

(60) Provisional application No. 60/871,410, filed on Dec. 21, 2006.

(51) Int. Cl.
*H01L 21/44* (2006.01)
(52) U.S. Cl. .................................. 438/614; 438/612
(58) Field of Classification Search ................ 438/612, 438/613, 614
See application file for complete search history.

(56) References Cited

U.S. PATENT DOCUMENTS

| | | | |
|---|---|---|---|
| 6,989,326 B2 | 1/2006 | Tong et al. | |
| 7,112,523 B2 | 9/2006 | Horng | |
| 2002/0180064 A1 | 12/2002 | Hwan et al. | |
| 2004/0188378 A1* | 9/2004 | Wu et al. | 216/13 |
| 2004/0256734 A1* | 12/2004 | Farnworth et al. | 257/777 |

* cited by examiner

*Primary Examiner*—Bradley K Smith
(74) *Attorney, Agent, or Firm*—Robert D. Atkins

(57) ABSTRACT

A flip chip semiconductor device has a substrate with a plurality of active devices formed thereon. A contact pad is formed on the substrate in electrical contact with the plurality of active devices. A passivation layer is formed over the substrate and intermediate conduction layer. An adhesive layer is formed over the passivation layer. A barrier layer is formed over the adhesive layer. A wetting layer is formed over the barrier layer. The barrier layer and wetting layer in a first region are removed, while the barrier layer, wetting layer, and adhesive layer in a second region are maintained. The adhesive layer over the passivation layer in the first region are maintained until the solder bumps are formed. By keeping the adhesive layer over the passivation layer until after formation of the solder bumps, less cracking occurs in the passivation layer.

19 Claims, 4 Drawing Sheets

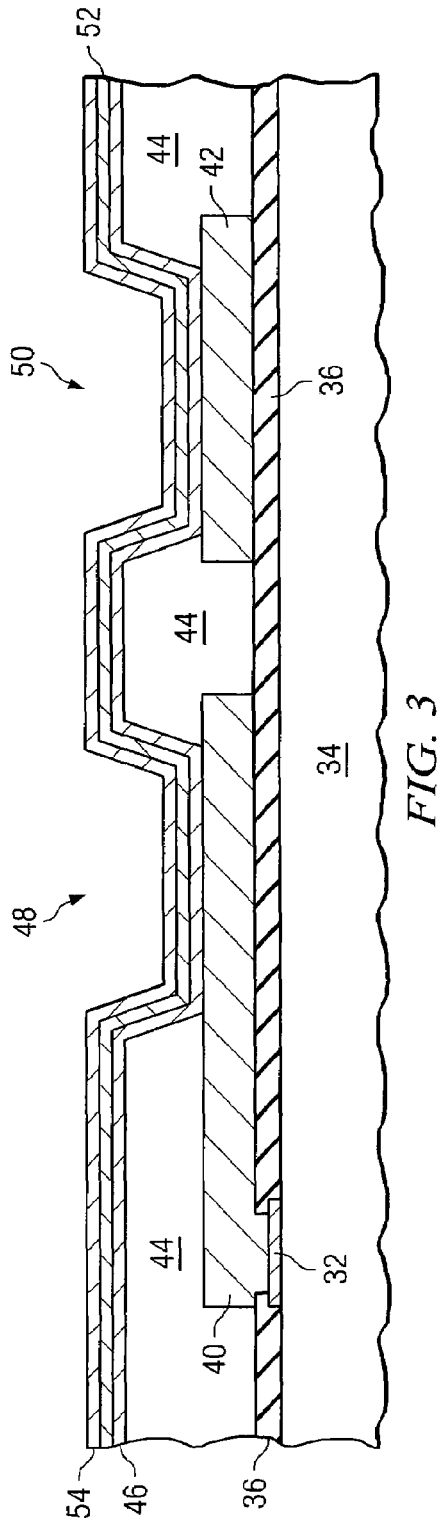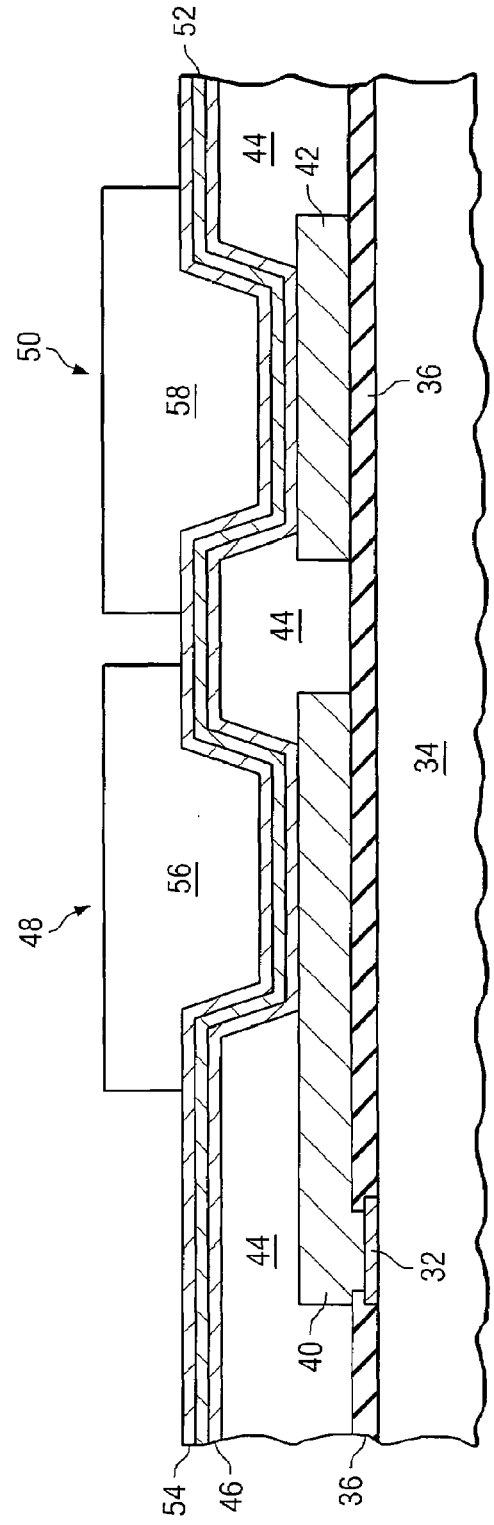
FIG. 3
FIG. 4

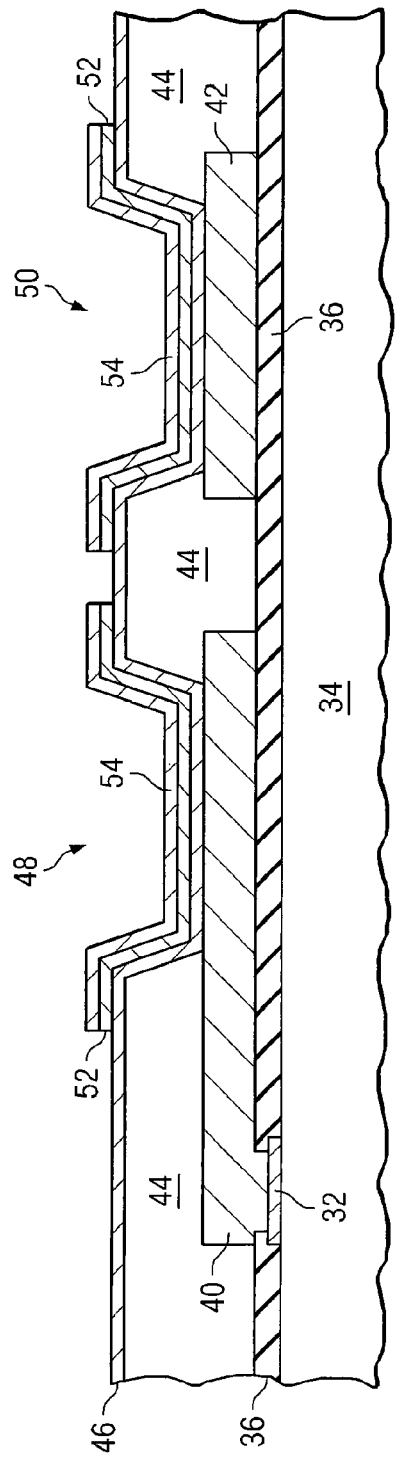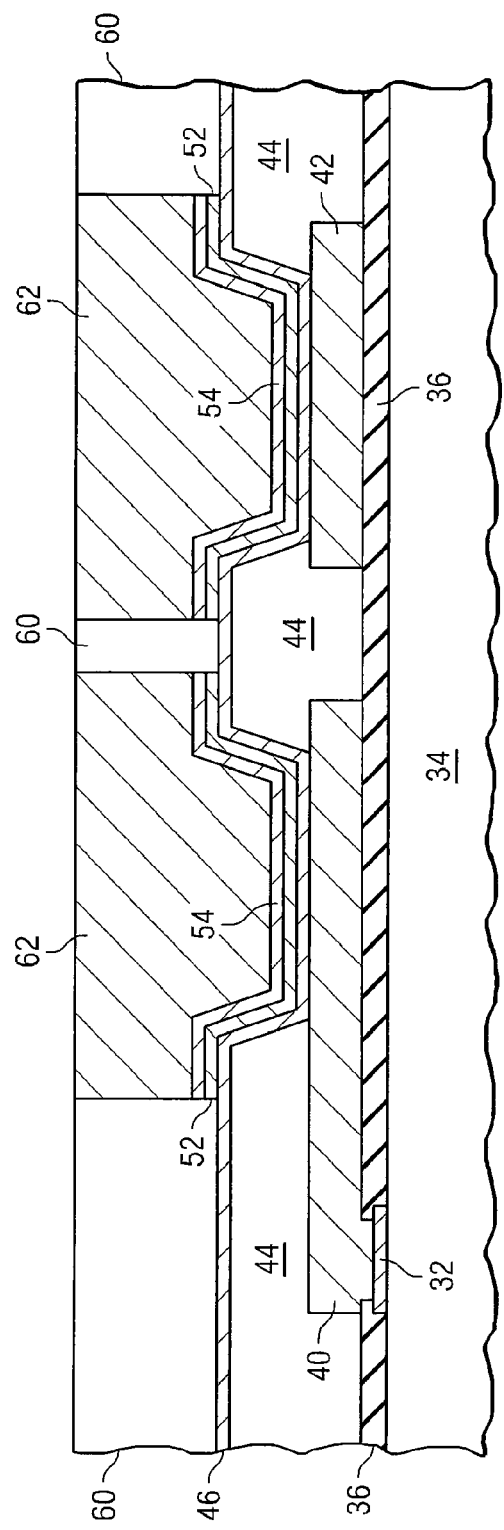
FIG. 5
FIG. 6

SEMICONDUCTOR DEVICE AND METHOD OF PROTECTING PASSIVATION LAYER IN A SOLDER BUMP PROCESS

CLAIM TO DOMESTIC PRIORITY

The present non-provisional patent application claims the benefit of priority of provisional application Ser. No. 60/871,410, entitled "Method of Protecting Passivation Surface in Solder Bumping Process," filed on Dec. 21, 2006.

FIELD OF THE INVENTION

The present invention relates in general to semiconductor devices and, more particularly, to formation of solder bump structures on semiconductor devices.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

The reliability and integrity of the interconnect structure is important to testing, manufacturing yield, and longevity of the product while in service. In some devices, a problem of cracking has been detected in the passivation layer surrounding the solder bump after solder reflow. The cracking has been attributed to degradation of the passivation layer caused by the chemical processes used during formation of the solder bumps. The cracking problem is especially noted during formation and removal of dry film used to create the solder bumps.

A need exists for a solder bump structure with enhanced strength and reliability.

SUMMARY OF THE INVENTION

In one embodiment, the present invention is a method of making a semiconductor device comprising the steps of providing a substrate having a plurality of active devices formed thereon, forming a contact pad on the substrate in electrical contact with the plurality of active devices, disposing an intermediate conduction layer above the substrate in electrical contact with the contact pad, forming a passivation layer over the substrate and intermediate conduction layer, forming an adhesive layer substantially covering the passivation layer, forming a barrier layer over the adhesive layer, forming a wetting layer over the barrier layer, and removing the barrier layer and wetting layer in a first region, while maintaining the barrier layer, wetting layer, and adhesive layer in a second region. The adhesive layer over the passivation layer in the first region is also maintained at this stage of the process. The method further includes the steps of patterning a dry film over the adhesive layer in the first region, depositing solder material over the wetting layer, barrier layer, and adhesive layer in the second region in areas between the dry film, reflowing the solder material to form solder bumps, and removing the dry film. The adhesive layer substantially covering the passivation layer reduces cracking in the passivation layer during formation of the solder bumps.

In another embodiment, the present invention is a method of making a semiconductor device comprising the steps of providing a substrate having a plurality of active devices formed thereon, forming a contact pad on the substrate in electrical contact with the plurality of active devices, forming a passivation layer over the substrate, forming an adhesive layer over the passivation layer, forming a wetting layer over the adhesive layer, and removing the wetting layer in a first region while maintaining the wetting layer and adhesive layer in a second region. The adhesive layer over the passivation layer in the first region is also maintained during this stage of the process. The method further includes the steps of patterning a dry film over the adhesive layer in the first region, depositing solder material over the wetting layer and adhesive layer in the second region in areas between the dry film, reflowing the solder material to form solder bumps, and removing the dry film. The adhesive layer substantially covering the passivation layer reduces cracking in the passivation layer during formation of the solder bumps In another embodiment, the present invention is a method of making a semiconductor device comprising the steps of providing a substrate having a plurality of active devices formed thereon, forming a contact pad on the substrate in electrical contact with the plurality of active devices, forming a passivation layer over the substrate, forming an adhesive layer over the passivation layer, forming a wetting layer over the adhesive layer, and removing the wetting layer in a first region while maintaining the wetting layer and adhesive layer in a second region. The adhesive layer over the passivation layer in the first region is also maintained at this stage of the process. The method further includes the steps of depositing solder material over the wetting layer and adhesive layer in the second region, and reflowing the solder material to form solder bumps. The adhesive layer over the passivation layer reduces cracking in the passivation layer during formation of the solder bumps.

In another embodiment, the present invention is a semiconductor device comprising a substrate having a plurality of active devices formed thereon. A contact pad is formed on the substrate in electrical contact with the plurality of active devices. A passivation layer is formed over the substrate. An adhesive layer is formed over the passivation layer. A wetting layer is formed over the adhesive layer. A plurality of solder bumps is formed over the wetting layer and adhesive layer. The adhesive layer remains over the passivation layer until the solder bumps are formed to reduce cracking in the passivation layer.

BRIEF DESCRIPTION OF THE DRAWINGS

FIG. 3 illustrates formation of a barrier layer and wetting layer over the adhesive layer;

FIG. 4 illustrates patterning the UBM structure prior to etching portions of the barrier layer and wetting layer;

FIG. 5 illustrates removing portions of the barrier layer and wetting layer in a region outside the UBM structure while leaving the adhesive layer intact over the passivation layer;

FIG. 6 illustrates formation of dry film layer over the adhesive layer, which protects the passivation layer and the deposition of solder material;

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Figure 1:
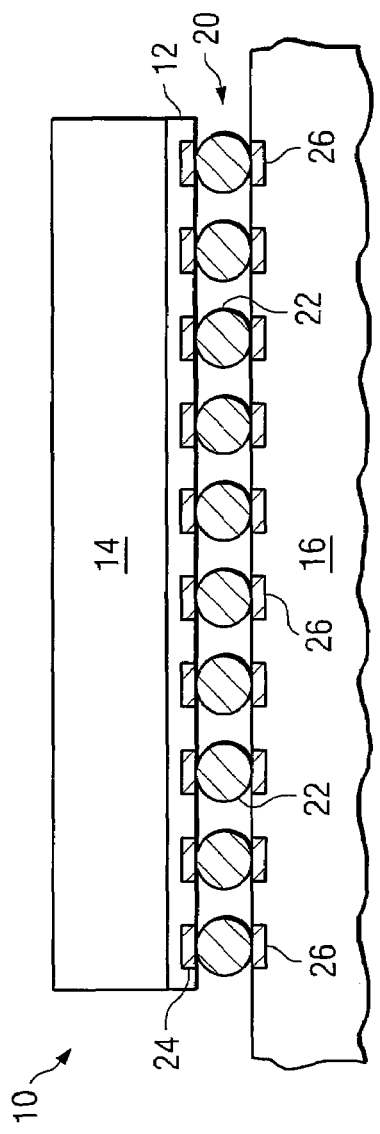
FIG. 1 is a flip chip semiconductor device with solder bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device 10 involves mounting an active area 12 of die 14 facedown toward a chip carrier substrate or printed circuit board (PCB) 16, as shown in FIG. 1. Active area 12 contains active and passive devices, conductive layers, and dielectric layers according to the electrical design of the die. The electrical and mechanical interconnect is achieved through a solder bump structure 20 comprising a large number of individual conductive solder bumps or balls 22. The solder bumps are formed on bump pads 24, which are disposed on active area 12. The bump pads 24 connect to the active circuits by conduction tracks in active area 12. The solder bumps 22 are electrically and mechanically connected to contact pads 26 on carrier substrate 16 by a solder reflow process. The flip chip semiconductor device provides a short electrical conduction path from the active devices on die 14 to conduction tracks on carrier substrate 16 in order to reduce signal propagation, lower capacitance, and achieve overall better circuit performance.

Figure 2:
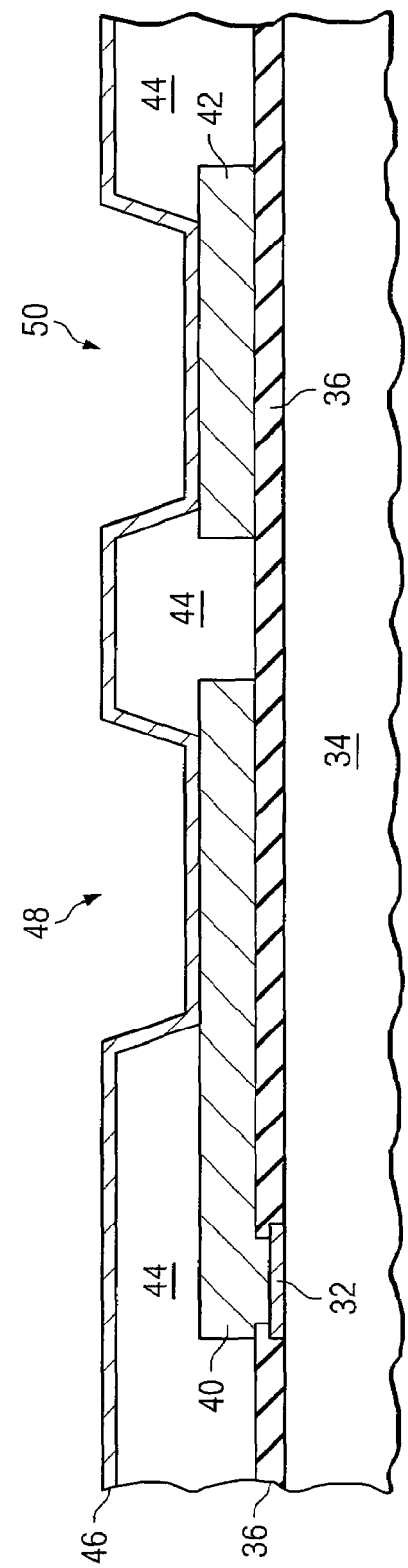
FIG. 2 illustrates formation of an adhesive layer over the second passivation layer.

FIG. 2 illustrates a cross-sectional view of the formation of a support structure for a solder bump. Note that for FIGS. 2-8 the semiconductor device is oriented with its active surface facing up. In FIG. 2, metal contact pad 32 is formed on silicon substrate 34. Contact pad 32 is made of aluminum (Al), copper (Cu), or aluminum/copper alloys. Contact pad 32 is electrically connected to active and passive devices through conduction tracks or layers formed on substrate 34. A solder bump will later be formed to connect through an RDL to the metal contact pad. A first passivation layer 36 is formed over substrate 34 with an opening to expose metal contact pad 32. The opening is realized by removing a portion of passivation layer 36 through a photoresist mask defined etching process. The first passivation layer 36 can be made with silicon nitride (SiN), silicon dioxide (SiO2), silicon oxynitride (SiON), polyimide (PI), benzocyclobutene (BCB), polybenzoxazole (PBO), or other insulating material.

A first redistribution layer (RDL) 40 is formed over first passivation layer 36, as shown in FIG. 2. RDL 40 provides electrical contact between pad 32 and solder bump area 48 which is provided for the first solder bump. A second RDL 42 is also is formed over first passivation layer 36. RDL 42 provides electrical contact between other conduction tracks on substrate 34 and solder bump area 50 which is provided for the second solder bump. The first and second RDLs can be made with Aluminum (Al), Aluminum Copper alloy (AlCu), Cu, or Cu alloy. RDLs 40 and 42 operate as an intermediate conduction layer to route electrical signals to various areas of the die, including active and passive circuits, and provides various electrical interconnect options during package integration.

A second passivation layer 44 is formed over first passivation layer 36 and RDLs 40 and 42. The second passivation layer is thicker than RDLs 40 and 42. In one embodiment, passivation layer 44 is about 5-15 μm in thickness and RDL 40 is about 1-3 μm in thickness. Passivation layer 44 can be made using similar material as described for passivation layer 36. In another embodiment, passivation layers 36 and 44 are formed by repassivation. A portion of second passivation layer 44 is removed by a photoresist mask defined etching process for the first and second solder bumps in areas 48 and 50 or the second passivation layer is photosensitive and can be patterned directly.

An adhesive layer 46 is formed on passivation layer 44 and RDLs 40 and 42. In one embodiment, adhesive layer 46 is about 200-2000 angstroms in thickness. Adhesive layer 46 can be titanium (Ti), Al, titanium tungsten (TiW), and chromium (Cr). Adhesive layer 46 is patterned to follow the contour of passivation layer 44 and RDLs 40 and 42. Accordingly, the formation of adhesive layer 46 is depressed in solder bump areas 48 and 50 and covers substantially the entire surface of passivation layer 44, particularly in and around areas 48 and 50, as seen in FIG. 2.

FIG. 3 illustrates a barrier layer 52 formed over adhesive layer 46, and wetting layer 54 formed over barrier layer 52. Barrier layer 52 and wetting layer 54, in combination with adhesive layer 46, forms an under bump metallization (UBM) in areas 48 and 50 for the first and second solder bumps. The adhesion layer 46 bonds to barrier layer 52. Barrier layer 52 inhibits the diffusion of materials destructive to silicon such as Cu into the active area of the die. Barrier layer 52 is optional depending on the materials used and the application. Wetting layer 54 electrically connects to contact pad 32 via RDL 40. In one embodiment, barrier layer 52 is about 3000-4000 angstroms in thickness, and wetting layer 54 is about 5000-10000 angstroms in thickness. Barrier layer 52 can be made of nickel (Ni), Ni-alloy, platinum (Pt), palladium (Pd), TiW, and chromium copper (CrCu). Wetting layer 54 can be made with Cu, gold (Au), or Al. Barrier layer 52 is patterned to follow the contour of adhesive layer 46. Likewise, wetting layer 54 is patterned to follow the contour of barrier layer 52 and acts as an intermediate conduction layer formed between the first solder bump and RDL 40. The patterning barrier layer 52 and wetting layer 54 and adhesive layer 46, as described above, define the solder bump areas 48 and 50 for forming solder bumps. The barrier layer 52 and wetting layer 54 and adhesive layer 46 enhance reliability of the bump support structure.

In FIG. 4, a photoresist layer is deposited over wetting layer 54. The photoresist layer is patterned to provide photoresist layers 56 and 58 over solder bump areas 48 and 50, respectively. In FIG. 5, the portions of barrier layer 52 and wetting layer 54, which are not protected by photoresist layers 56 and 58, are removed using a wet etch process. That is, only the portions of wetting layer 54 and barrier layer 52 in the region outside the UBM structure are etched away. The adhesive layer 46 in the region outside the UMB structure remains in place at this stage of the process. As will be shown, the portion of adhesive layer 46 in the region outside solder bump areas 48 and 50 protects passivation layer 44 from chemical degradation during formation of the solder bumps in later stages of the process. Photoresist layers 56 and 58 are then removed, leaving the UBM structure comprising adhesive layer 46, barrier layer 52, and wetting layer 54 only in solder bump areas 48 and 50.

In FIG. 6, a dry film layer 60 is deposited over adhesive layer 46 and the UBM structure comprising adhesive layer 46, barrier layer 52, and wetting layer 54. The dry film layer is patterned, and the portion of the dry film over the UBM structure is removed. Solder material 62 is deposited over the UBM structure between the patterned dry film layer through a screen printing, or electrolytic plating or electroless plating process. The solder material can be any metal or electrically conductive material, e.g., tin (Sn), lead (Pb), Ni, Au, silver (Ag), Cu, bismuthinite (Bi) and alloys thereof, or mixtures of other electrically conductive material. In one embodiment, the solder material is 63 percent weight of Sn and 37 percent weight of Pb.

Figure 7:
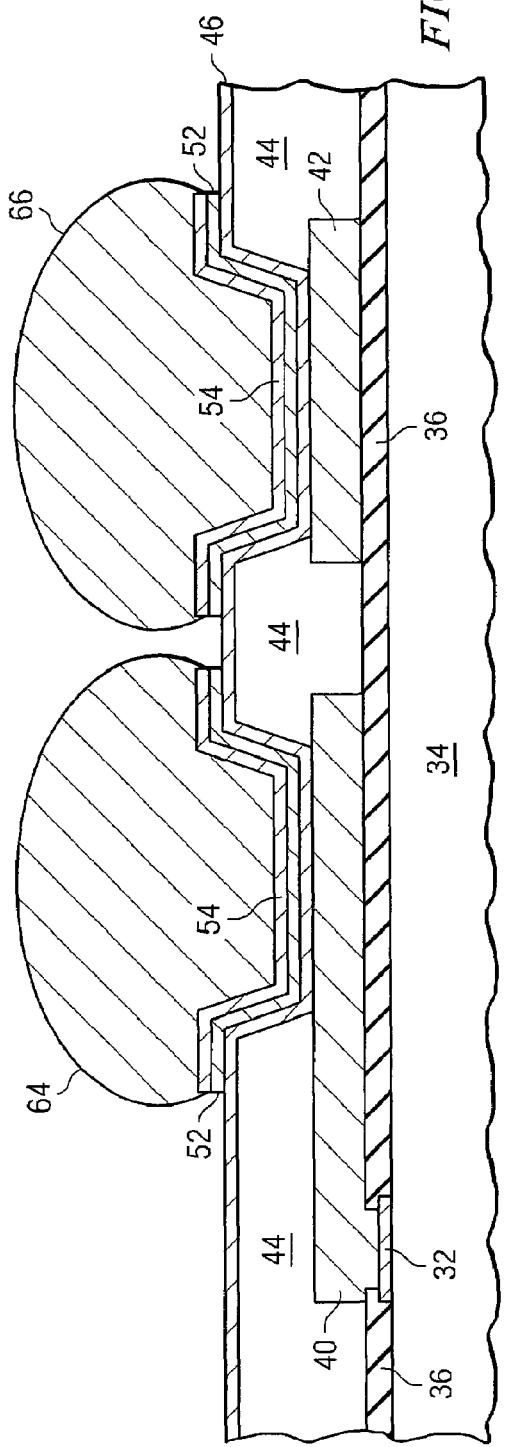
FIG. 7 illustrates reflow of the solder material to form solder bumps and removal of dry film layer.

In FIG. 7, the solder material is reflowed by heating the conductive material above its melting point to form spherical balls or bumps 64 and 66 over semiconductor substrate 34. In one embodiment, solder bumps 64 and 66 are about 70~180 μm in height. In some applications, solder bumps 64 and 66 are reflowed a second time to improve electrical contact to the UBM structure.

It is important to note that during the solder bump formation process, the adhesive layer 46 in the region outside the UBM structure remains in place. The previous step of removing the portion of wetting layer 54 and barrier layer 52 in the region outside the UBM structure did not involve adhesive layer 46. The adhesive layer 46 in the region outside the UBM structure remains in place and protects passivation layer 44 against chemical degradation during the formation of the solder bumps, in particular during deposition and remove of dry film layer 60. The adhesive layer over the passivation layer reduces cracking of the passivation layer 44 without incurring additional manufacturing costs.

Figure 8:
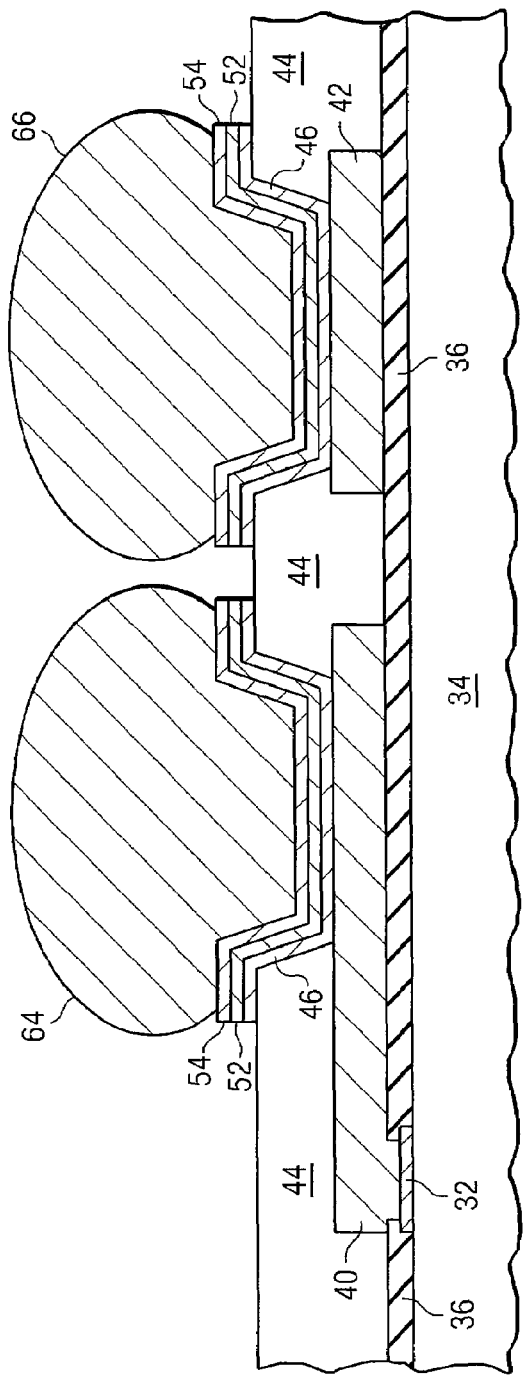
FIG. 8 illustrates removal of the adhesive layer from the region outside the UBM structure.

In FIG. 8, a wet etching process applied to remove any portion of adhesion layer 46 in the region outside the region of the solder bump structure using solder bumps as the etching mask. Solder bump 64 electrically contacts metal contact pad 32 by way of RDL 40. Likewise, solder bump 66 electrically contacts RDL 42.

In another embodiment, semiconductor device 10 can be made with a direct contact between the solder bump and the contact pad, i.e., without RDLs or other conductive routing structure. In this case, contact pad 32 is formed directly under the UBM structure. A similar process, as described in FIGS. 2-8, would be used for the direct solder bump to contact pad embodiment. The adhesive layer in the region outside the UBM structure protects the passivation layer against chemical degradation during formation of the solder bumps, particularly during deposition and removal of dry film layer. Again, the adhesive layer over the passivation layer reduces cracking of the passivation layer without incurring additional manufacturing costs.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a substrate having a plurality of active devices formed thereon;
    forming a contact pad on the substrate in electrical contact with the plurality of active devices;
    disposing an intermediate conduction layer above the substrate in electrical contact with the contact pad;
    forming a passivation layer over the substrate and intermediate conduction layer;
    forming an adhesive layer substantially covering over the passivation layer;
    forming a barrier layer over the adhesive layer;
    forming a wetting layer over the barrier layer;
    removing the barrier layer and wetting layer in a first region while maintaining the barrier layer, wetting layer, and adhesive layer in a second region and maintaining the adhesive layer over the passivation layer in the first region;

patterning a dry film over the adhesive layer in the first region;

depositing bump material over the wetting layer, barrier layer, and adhesive layer in the second region in areas between the dry film;

reflowing the bump material to form interconnect bumps, wherein the adhesive layer substantially covering the passivation layer reduces cracking in the passivation layer during formation of the interconnect bumps; and removing the dry film.

2. The method of claim 1, further including removing the adhesive layer in the first region after reflowing the solder material to form the interconnect bumps.

3. The method of claim 1, wherein the wetting layer, barrier layer and adhesive layer constitute an under bump metallization structure.

4. The method of claim 1, wherein the adhesive layer follows a contour of the passivation layer.

5. The method of claim 1, wherein the adhesive layer is made with a material selected from the group consisting of titanium, aluminum, titanium tungsten, and chromium.

6. A method of making a semiconductor device, comprising:

providing a substrate having a plurality of active devices formed thereon;

forming a contact pad on the substrate in electrical contact with the plurality of active devices;

forming a passivation layer over the substrate;

forming an adhesive layer over the passivation layer;

forming a wetting layer over the adhesive layer;

removing the wetting layer in a first region while maintaining the wetting layer and adhesive layer in a second region and maintaining the adhesive layer over the passivation layer in the first region;

patterning a dry film over the adhesive layer in the first region;

depositing bump material over the wetting layer and adhesive layer in the second region in areas between the dry film;

reflowing the bump material to form interconnect bumps, wherein the adhesive layer substantially covering the passivation layer reduces cracking in the passivation layer during formation of the interconnect bumps; and removing the dry film.

7. The method of claim 6, further including removing the adhesive layer in the first region after reflowing the solder material to form the interconnect bumps.

8. The method of claim 6, further including disposing an intermediate conduction layer above the substrate in electrical contact with the contact pad.

9. The method of claim 6, further including forming a barrier layer between the adhesive layer and the wetting layer.

10. The method of claim 6, wherein the wetting layer and adhesive layer constitute an under bump metallization structure.

11. The method of claim 6, wherein the adhesive layer follows a contour of the passivation layer.

12. A method of making a semiconductor device, comprising:

providing a substrate having a plurality of active devices formed thereon;

forming a contact pad on the substrate in electrical contact with the plurality of active devices;

forming a passivation layer over the substrate;

forming an adhesive layer over the passivation layer;

forming a wetting layer over the adhesive layer;

removing the wetting layer in a first region while maintaining the wetting layer and adhesive layer in a second region and maintaining the adhesive layer over the passivation layer in the first region;

depositing bump material over the wetting layer and adhesive layer in the second region; and reflowing the bump material to form interconnect bumps, wherein the adhesive layer over the passivation layer reduces cracking in the passivation layer during formation of the interconnect bumps.

13. The method of claim 12, further including removing the adhesive layer in the first region after reflowing the solder material to form the interconnect bumps.

14. The method of claim 12, further including disposing an intermediate conduction layer above the substrate in electrical contact with the contact pad.

15. The method of claim 12, further including forming a barrier layer between the adhesive layer and the wetting layer.

16. The method of claim 12, further including:

patterning a dry film over the adhesive layer in the first region prior to the step of depositing solder material over the wetting layer and adhesive layer in the second region; and removing the dry film after the step of depositing solder material over the wetting layer and adhesive layer in the second region.

17. The method of claim 12, wherein the wetting layer and adhesive layer constitute an under bump metallization structure.

18. The method of claim 12, wherein the adhesive layer follows a contour of the passivation layer.

19. The method of claim 12, wherein the adhesive layer is made with a material selected from the group consisting of titanium, aluminum, titanium tungsten, and chromium.

* * * * *